United States Patent [19]
Yamaguchi et al.

[11] Patent Number: 5,962,133
[45] Date of Patent: Oct. 5, 1999

[54] SOLDER, ELECTRONIC COMPONENT MOUNTED BY SOLDERING, AND ELECTRONIC CIRCUIT BOARD

[75] Inventors: Atsushi Yamaguchi, Moriguchi; Kenichiro Suetsugu, Nishinomiya; Tetsuo Fukushima; Akio Furusawa, both of Katano, all of Japan

[73] Assignee: Matsushita Electric Industrial Co., Ltd., Osaka, Japan

[21] Appl. No.: 08/981,565

[22] PCT Filed: Jun. 19, 1996

[86] PCT No.: PCT/JP96/01680

§ 371 Date: Dec. 19, 1997

§ 102(e) Date: Dec. 19, 1997

[87] PCT Pub. No.: WO97/00753

PCT Pub. Date: Jan. 9, 1997

[30] Foreign Application Priority Data

Jun. 20, 1995 [JP] Japan .................................. 7-153064

[51] Int. Cl.⁶ .............................. B32B 5/16; B32B 15/00
[52] U.S. Cl. ....................... 428/403; 428/378; 428/379; 428/385; 428/209; 106/286.2; 228/180.21; 228/208; 228/224
[58] Field of Search .............................. 228/180.21, 208, 228/224; 106/286.2; 428/209, 403, 378, 379, 385

[56] References Cited

U.S. PATENT DOCUMENTS

| | | | |
|---|---|---|---|
| 2,958,941 | 11/1960 | Goerg, Sr. ................................ | 228/224 |
| 3,075,486 | 1/1963 | Laubmeyer et al. .................... | 228/224 |
| 3,413,711 | 12/1968 | Brewer et al. ........................... | 228/208 |
| 4,582,975 | 4/1986 | Daughton ............................ | 228/180.21 |
| 4,821,946 | 4/1989 | Abe et al. .......................... | 228/180.21 |
| 5,361,966 | 11/1994 | Kanbe et al. ...................... | 228/180.21 |
| 5,498,575 | 3/1996 | Onishi et al. ...................... | 228/180.21 |
| 5,509,599 | 4/1996 | Laue ................................... | 228/180.21 |
| 5,759,379 | 6/1998 | Cavallotti et al. ...................... | 228/208 |

FOREIGN PATENT DOCUMENTS

| | | |
|---|---|---|
| 63-10587 | 1/1988 | Japan . |
| 4-3491 | 1/1992 | Japan . |
| 4-148555 | 5/1992 | Japan . |
| 5-13638 | 1/1993 | Japan . |
| 5-337679 | 12/1993 | Japan . |
| 6-209025 | 7/1994 | Japan . |
| 8-57680 | 3/1996 | Japan . |
| 8-108292 | 4/1996 | Japan . |

OTHER PUBLICATIONS

Japanese language search report for Int'l Appln No. PCT/JP96/01680 dated Sep. 24, 1996.
English translation of Japanese language search report for Int'l Appln No. PCT/JP96/01680.

*Primary Examiner*—Deborah Jones
*Assistant Examiner*—Cathy F. Lam
*Attorney, Agent, or Firm*—Ratner & Prestia

[57] ABSTRACT

The occurrence of partial chip detachment is reduced by improving wettability for increasing the bonding strength, and by enabling gradual melting of the solder. Solder material, electronic components, and electronic circuit boards with higher performance and higher reliability are offered. The surface of a solder core, lead-frame surface and electrode surface of electronic components, and copper (Cu) land surface of electronic circuit boards are coated with metal element, which is either indium (In) or bismuth (Bi).

8 Claims, 11 Drawing Sheets

Land

FIG. 13B

Chip  Solder
Solder resist

SOLDER, ELECTRONIC COMPONENT MOUNTED BY SOLDERING, AND ELECTRONIC CIRCUIT BOARD

THIS APPLICATION IS A U.S NATIONAL PHASE APPLICATION OF PCT INTERNATIONAL APPLICATION PCT/JP96/01680, filed Jun. 19, 1996.

FIELD OF THE INVENTION

The present invention relates to the field of solder used for soldering, and electronic components mounted by soldering and electronic circuit boards.

BACKGROUND OF THE INVENTION

Figure 14:
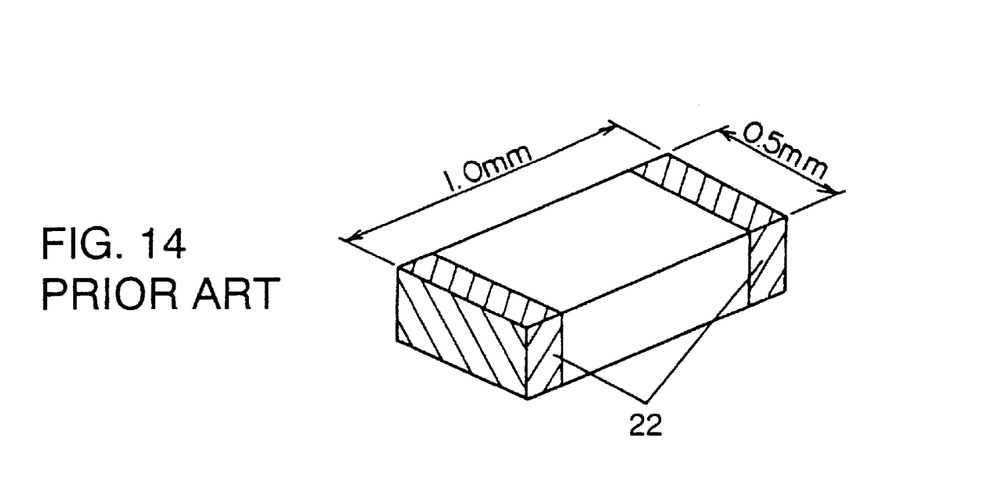
FIG. 14 is a surface mounting electronic component of the prior art.

The density of surface mounting on electronic circuit boards is continuing to increase as a result of miniaturization of electronic componentsand the narrowing pitch of electrodes. Typically, higher density mounting is accelerating due to development of narrower pitch in 1005 type chips (standard) which have 1.0 mm length and 0.5 mm width, as shown in FIG. 14, and QFP (Quad Flat Package) at 0.3 mm pitch of leads. Higher performance and higher reliability of solder material used for mounting are thus required.

A problem has arisen, from the environmental aspect, in the use of solder material made of alloy of tin and lead (Sn—Pb) because of its lead content. Specifically, when electronic equipment using solder material containing lead are disposed of and exposed to acid rain, toxic lead elutes in a large quantities, causing environmental problems. Accordingly, development of new solder material which does not contain lead (lead-free solder) is required to replace conventional lead-containing solder.

An example of conventional solder is explained next.

Figure 15:
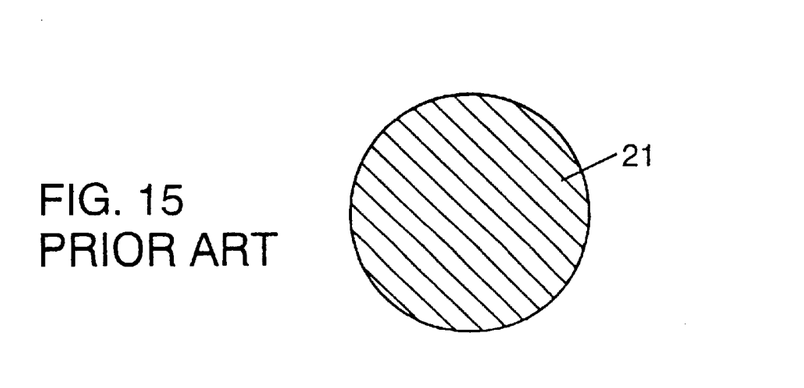
FIG. 15 is a brief section view of solder powder of the prior art.

FIG. 15 shows a brief sectional view of solder powder of the prior art. Solder powder 21 is mixed with flux to make solder paste which is used in surface mounting technology. The metal composition of the solder paste is a eutectic alloy of tin (Sn) and lead (Pb). The eutectic point of 63Sn—37Pb (composition ratio is percentage by weight), for example, is 183° C.

An example of an electrode, an electronic component of the prior art is explained next. FIG. 14 shows a surface mounting electronic component of the prior art. As shown in FIG. 14, the surface of an electrode 22 of the electronic component is plated with tin (Sn) or solder (90Sn—10Pb).

The lands on an electronic circuit board of the prior art are copper (Cu) which are either non-plated, or surface plated with gold (Au) or solder (90Sn—10Pb).

The lands of the electronic circuit board and electrodes or lead frames of electronic components are bonded by soldering.

The above conventional structure, however, may cause defective solder wettability; an insufficiently diffused layer between the copper (Cu) land and the solder, or between the electrode or lead frame of the electronic component and the solder; and insufficient bonding strength due to creation of brittle intermetalic compounds of copper/tin alloy between the lands and the solder.

Solder wettability here means spreadability of solder when it is melted.

In addition, the prior art has insufficient reliability of soldered portions due to shorting of electronic circuits caused by whiskering of tin (Sn) and cracking caused by the different linear expansion coefficients of copper (Cu) land and solder.

Furthermore, higher density of electronic circuits has steadily led to miniaturization of electronic components, causing partial detachment of chips due to sudden melting of solder at the eutectic point and insufficient wetting.

Figure 5:
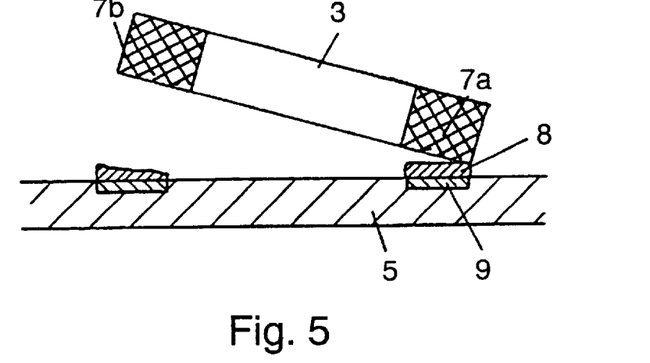
FIG. 5 illustrates partial detachment of a chip.

Partial detachment of chips here means a rise in a part of the electronic component 3 on soldering after it is mounted on an electronic circuit board 5, as shown in FIG. 5. This inappropriate mounting of electronic components causes defective conductivity. In particular, partial chip detachment occurs often with small electronic components such as the 1005 chips mentioned above. This has led to difficulties in making electronic circuits with further higher density.

DISCLOSURE OF THE INVENTION

The present invention improves bonding strength by improving wettability, and also prevents partial chip detachment by ensuring gradual melting of solder. The present invention thus offers a solder material, electronic component, and electronic circuit board with better performance and higher reliability.

DESCRIPTION OF THE PREFERRED EMBODIMENTS

The present invention achieves the abovementioned objectives by coating the solder of the prior art, lead frame surface and electrode surface of electronic components, and copper (Cu) lands of electronic circuit boards with a metal element, which is indium (In) or bismuth (Bi).

The reason for coating with indium (In) or bismuth (Bi) as mentioned above is explained next.

The surface tension of melted solder can be reduced by adding only either indium (In) or bismuth (Bi). This will improve the wettability of the solder and increase bonding strength.

In addition, coating enables the gradual melting of solder, preventing partial detachment of chips.

As explained above, the present invention improves bonding strength by coating the solder, electronic components, and electronic circuit boards with one or other of the above metal elements.

Suppression of the occurrence of partial detachment also allows assembly of electronic components with high reliability.

The solder, electronic components, and electronic circuit board of the present invention are explained next with reference to drawings.

First Exemplary Embodiment

Figure 1:
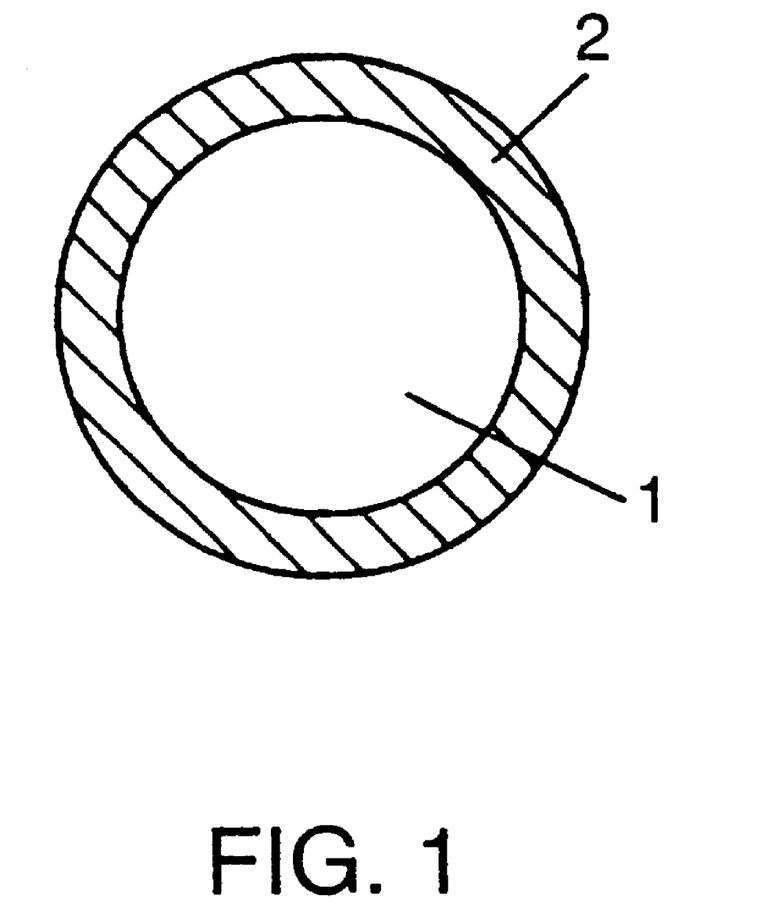
FIG. 1 is a section view of solder powder whose surface is coated with indium (In) in accordance with a first exemplary embodiment of the present invention.

FIG. 1 shows an outline of solder powder in solder paste in a first exemplary embodiment of the present invention. A coating film of indium 2 is provided over the surface of a solder core 1. Here, the solder core 1 is conventional solder. In this exemplary embodiment an alloy of tin and lead is used as the solder core 1. However, it can be any solder containing tin including lead-free solder such as Sn—Ag—Zn—Bi solder, Sn—Ag—Zn—In solder, or Sn—Ag—Bi—Cu solder.

In this exemplary embodiment, a plating method is employed for coating indium over the surface of the solder material, but deposition and dispensing methods are also applicable.

Figure 2A:
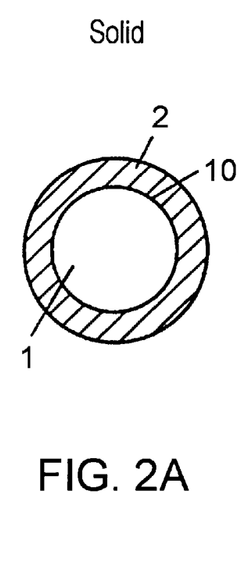
FIGS. 2A to 2E illustrate the melting process of solder powder in accordance with the first exemplary embodiment of the present invention.

Next, the melting process of solder powder of this exemplary embodiment is explained. FIGS. 2A to 2E illustrate the melting process of solder powder in this exemplary embodiment. FIG. 2A shows its state before the solder melts, and FIG. 2E illustrates the state of the solder powder after the solder has melted. The solder powder in this exemplary embodiment melts in the sequence shown in FIGS. 2A, 2B, 2C, 2D, and 2E. FIG. 3 shows an electronic circuit board on which electronic components such as transistors and capacitors are mounted. Electronic components 3 and 4 are placed on an electronic circuit board 5, and a lead frame 6 and electrode 7 are fixed by solder 8 (solder paste).

FIGS. 2 and 3 are used as an example of soldering the electronic circuit board and electronic component for explaining the melting of solder in detail.

After mounting the electronic components 3 and 4 onto the electronic circuit board 5, the electrode 7 and lead frame 6 of electronic components 3 and 4 are bonded to electrodes (lands) 9 on the electronic circuit board 5 by soldering. Here, the solder melts in the following sequence.

Figure 2B:
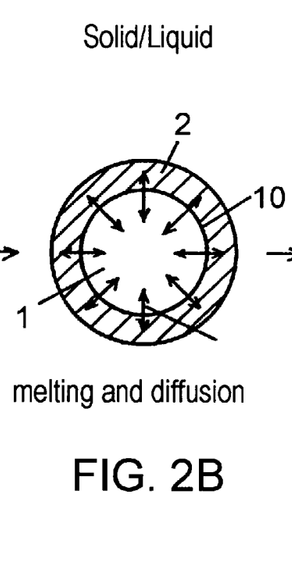
Figure 2C:
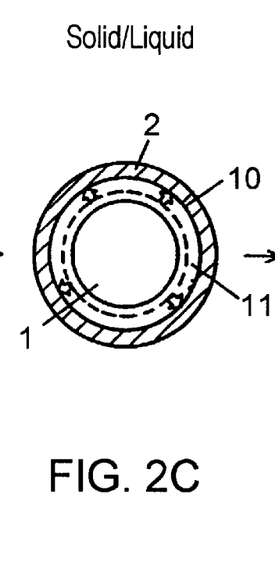
Figure 2D:
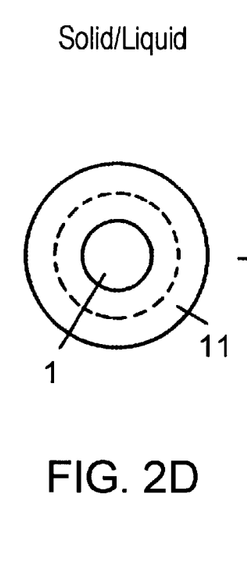
Figure 2E:
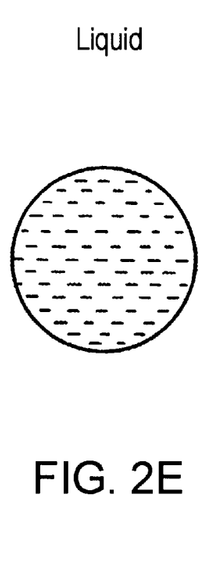
Figure 3:
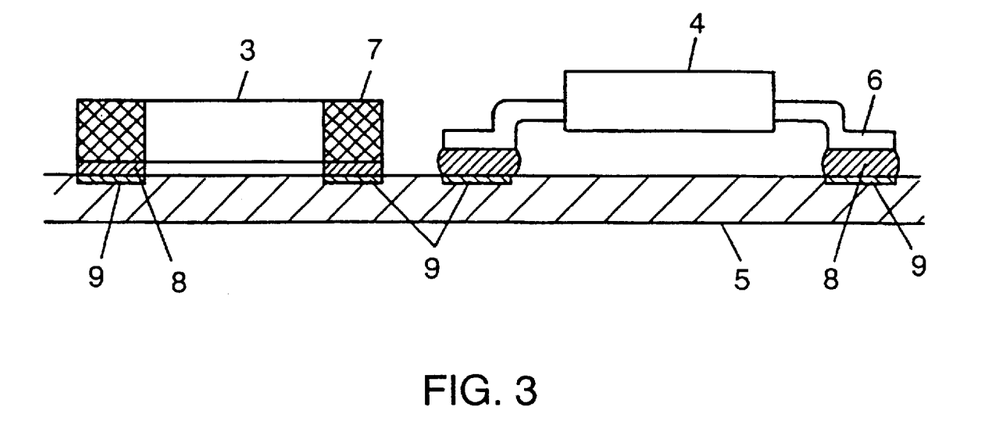
FIG. 3 is an electronic circuit board on which electronic components are mounted.

First, when the solder is heated, melting starts at a boundary surface 10 between the solder core 1 and indium (In) 2, generating eutectic alloy of tin (Sn) in the solder core and indium (In) 2, and tin (Sn) and indium (In) melt and diffuse as shown by the arrows in FIG. 2B. Then, when the heating temperature reaches the melting point (118° C.) of the eutectic alloy of indium (In) 2 and tin (Sn), the eutectic alloy 11 which has melted and diffused elutes as shown in FIG. 2C. The melted and diffused layer (the boundary surface between the solder core 1 and indium (In) 2) 10 gradually moves outward over the circumference of indium (In) 2, and the eutectic alloy 11 starts to elute from the circumference of the indium (In) 2 to wet the electrode 7 and lead frame 6 of the electronic components 3 and 4, and lands 9.

The melting point of tin is 232° C., lead is 328° C., indium is 156° C., and the solder powder of the present invention is 118° C. The indium (In) 2 is a metal with a low melting point and has the effect of reducing the melting point of the solder. Therefore, eutectic alloy of indium (In) 2 and tin (Sn) first starts to wet the electrode 6 and lead frame 7 of the electronic components and the electrode [copper (CU) land in this exemplary embodiment] of the electronic circuit board, and then the solder core 1 starts to melt. Progressive melting of the indium (In) 2 and solder core 1 causes gradual wetting, and reduces the occurrence of partial chip detachment.

The boundary surface 10 in FIG. 2 spreads out uniformly for briefly illustrating how the solder powder melts, but the boundary surface 10 actually melts non-uniformly. Eutectic metal starts to melt from a part of the circumference of the indium (In) 2, and gradually spreads out.

Figure 4A:
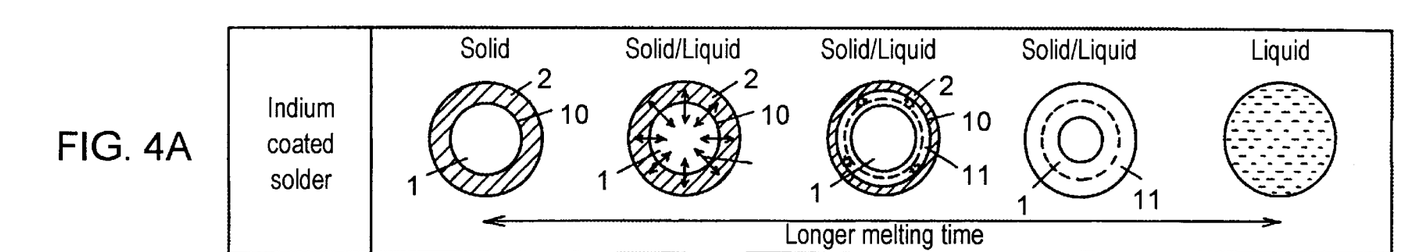
FIGS. 4A to 4C illustrate the melting state of solder powder in accordance with the first exemplary embodiment, indium-alloy solder, and conventional Sn—Pb solder.
Figure 4B:
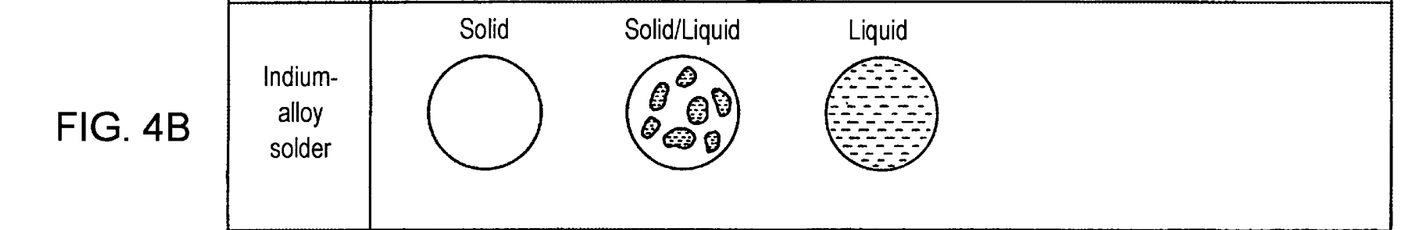
Figure 4C:
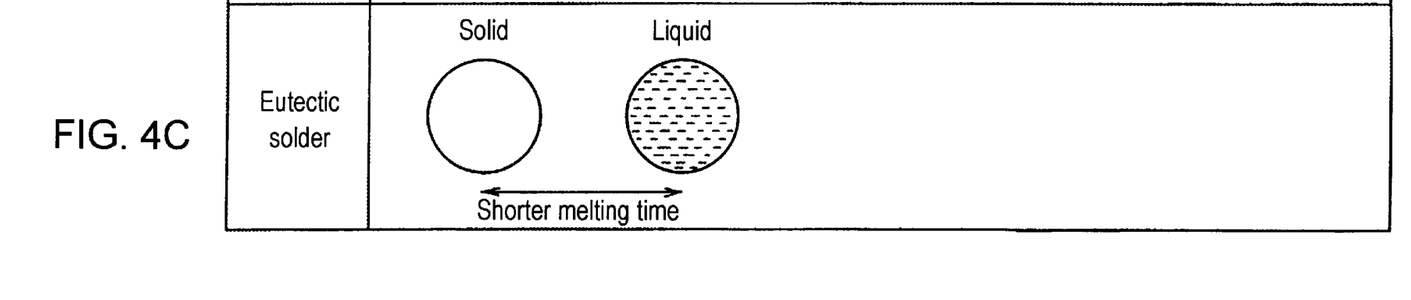

How partial detachment of chips is reduced is explained with reference to FIGS. 4A to 4C and 5. FIGS. 4A to 4C show the melting state of solder powder coated with indium in the first exemplary embodiment of the present invention, solder made of indium alloy containing indium, and conventional Sn—Pb solder.

As shown in FIG. 4C, solder not containing indium (In) 2 (Sn—Pb solder) abruptly changes from the solid to the liquid phase when it melts, which means its phase transformation range is extremely narrow. In general, for mounting electronic components onto an electronic circuit board by soldering, solder paste is first printed in the intended pattern on the electronic circuit board, electronic components are placed on the electronic circuit board in a way that electrodes or lead frames of electronic components contact the printed solder paste, and the electronic circuit board is heated in a reflow furnace to melt the solder for bonding. Here, the temperature inside the reflow furnace is not uniform, causing non-uniformity in the temperature of electrodes 7a and 7b of the electronic component 3. This may result in the melting of the solder for electrode 7a but not for the other electrode 7b of the electronic component 3. As explained above, since solder containing no indium (In) 2 changes abruptly from the solid to the liquid phase when the solder melts, the other electrode 7b is lifted up pulled by the surface tension of the solder for the electrode 7a.

Consequently, solder without indium (In) 2 is likely to cause partial detachment because the solder solidifies in the above condition.

On the other hand, as shown in FIG. 4A, solder coated with indium (In) 2 generates the eutectic alloy 11 of indium (In) and tin (Sn) on the boundary surface 10 between the indium (In) and tin (Sn), and gradually spreads out around the circumference of the indium. Melted eutectic alloy 11 then starts to elute from a part of the solder, wetting the land 9 and electrode 7 of the electronic component as it melts. At this point, a portion of indium (In) 2 remains unmelted, but gradually melts and diffuses afterwards. More specifically, melting and diffusion of indium (In) 2 and tin (Sn), and melting of melted and diffused eutectic alloy continue while the melted eutectic alloy of indium (In) 2 and tin (Sn) melts. Gradual generation of melted eutectic alloy of indium (In) 2 and tin (Sn) extends the transformation time when the solid and liquid solder coexist. This result in a slower transformation between the solid and liquid phases, requiring a certain time for solder to become completely solid. This allows the solder for the other electrode 7b of the electronic component to melt before the surface tension of the solder is generated by the solidification of the solder, enabling the electronic components to be soldered without causing partial chip detachment. The occurrence of partial detachment can thus be significantly reduced.

Solder made of indium alloy containing indium (In), however, is unable to reduce partial chip detachment which is possible with the present invention due to the following reasons.

As shown in FIG. 4B solder made of indium (In) alloy immediately generates a melted compound of solder (tin) and indium (In). This avoids progressive melting of eutectic alloy of indium (In) 2 and tin (Sn) first and then the solder core 1 as it is in the present invention as shown in FIG. 2. Wetting of solder thus does not occur gradually. Accordingly, the solder made of indium (In) alloy is unable to create a sufficient transformation time when the solid and liquid solder co-exist, resulting in partial chip detachment. In particular, partial detachment occurs at high levels with small electronic components such as 1005 chips.

As explained above, the present invention enables the progressive melting of the eutectic alloy of indium (In) 2 and tin (Sn), and then the solder core by coating the surface of the solder core with indium (In). This allows gradual wetting, and therefore the occurrence of partial chip detachment can be reduced.

Indium (In) 2 also reduces the surface tension of the melted solder, which improves the wettability of the copper (Cu) lands on the electronic circuit board, thereby increasing the bonding strength.

Furthermore, indium (In) is more likely to mutually diffuse with copper (Cu) compared to other metals. This enables the creation of a sufficiently diffused layer on the boundary surface with the copper (Cu), thereby increasing the bonding strength when the electrodes of electronic components are soldered to copper (Cu) lands as in this exemplary embodiment. Indium (In) is also a softer metal than copper (Cu) and solder material. This enables indium (In) to act as a buffer, absorbing any distortion caused by the different linear expansion coefficients of copper (Cu) and solder material and thus suppressing the occurrence of cracking and reducing internal stress in solder material, and, further, suppressing the occurrence of tin (Sn) whisker.

Accordingly, the present invention enables improved wettability of solder and reduces the occurrence of partial chip detachment by coating the surface of the solder core with indium (In).

Solder of the present invention is explained in detail next with reference to experimental data.

Figure 6:
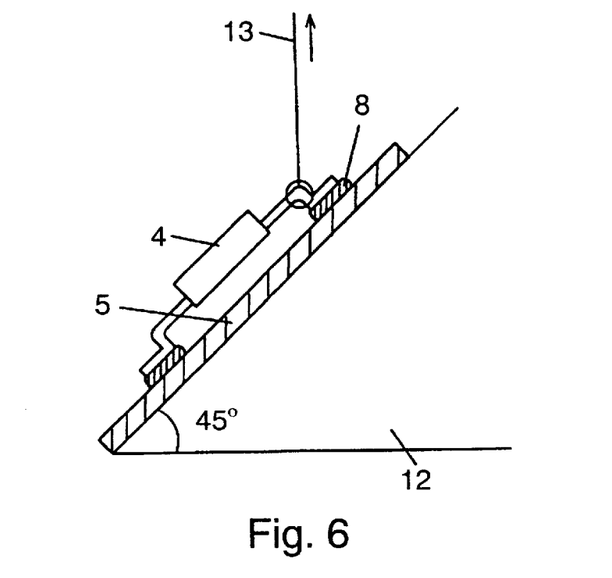
FIG. 6 is a solder bonding strength tester.

In this exemplary embodiment, a bonding strength test as shown in FIG. 6 was conducted for measuring the bonding strength of solder.

An electronic circuit board on which an electronic component is mounted was fixed on a table 12 angled at 45°. One electrode of the electronic component was hooked to a hook 13 and pulled upward. The electronic component was a QFP with 0.5-mm lead pitch. A tensile test was conducted twenty times, and the tensile strength when the electrode of the electronic component is peeled off was measured each time to calculate an average F.

Figure 7:
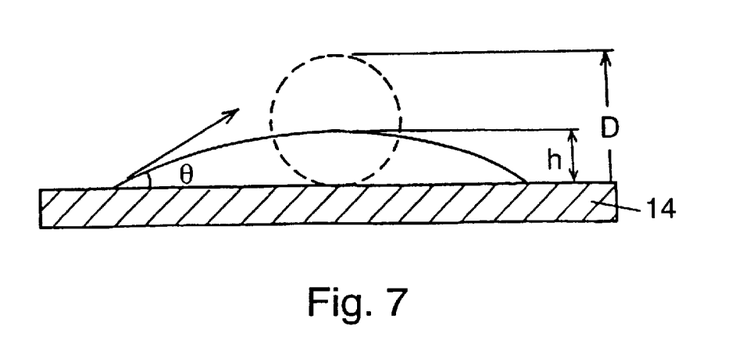
FIG. 7 explains wettability of solder.

Next, for measuring wettability, the wettability test shown in FIG. 7 was conducted.

This is a method called the spreadability ratio method. A certain amount of solder is melted and spread over a thin heated substrate 14, and the spreadability S (%) is calculated according to the following formula based on the ratio between the maximum height h of spread solder and the diameter D of the same volume of solder in spherical form.

Spreadability $S=(D-h)/D \times 100$

Figure 8:
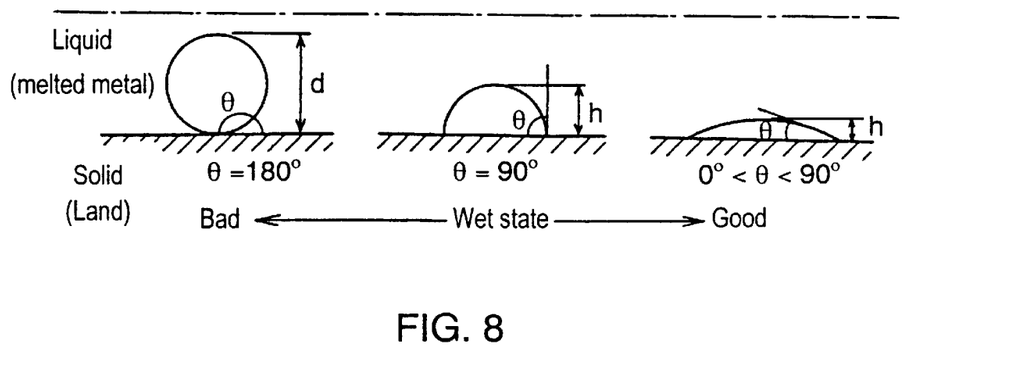
FIG. 8 illustrates the wet state.

FIG. 8 shows the wet state. As shown in the figure, a shorter maximum height h of spread solder is better.

Table 1 shows a comparison of the wettability and bonding strength among conventional solder, solder of the present invention, and indium (In)-alloy solder.

TABLE 1

|  | Spreadability S (%) | Bonding strength F (kg) |
| --- | --- | --- |
| Solder paste of the present invention | 91.0 | 1.15 |
| Conventional solder paste | 89.7 | 1.05 |
| Indium (In)-alloy solder paste | 90.0 | 1.07 |

It is apparent from Table 1 that the solder of the present invention excels in both wettability and bonding strength to conventional solder paste and indium-alloy solder paste.

Figure 9:
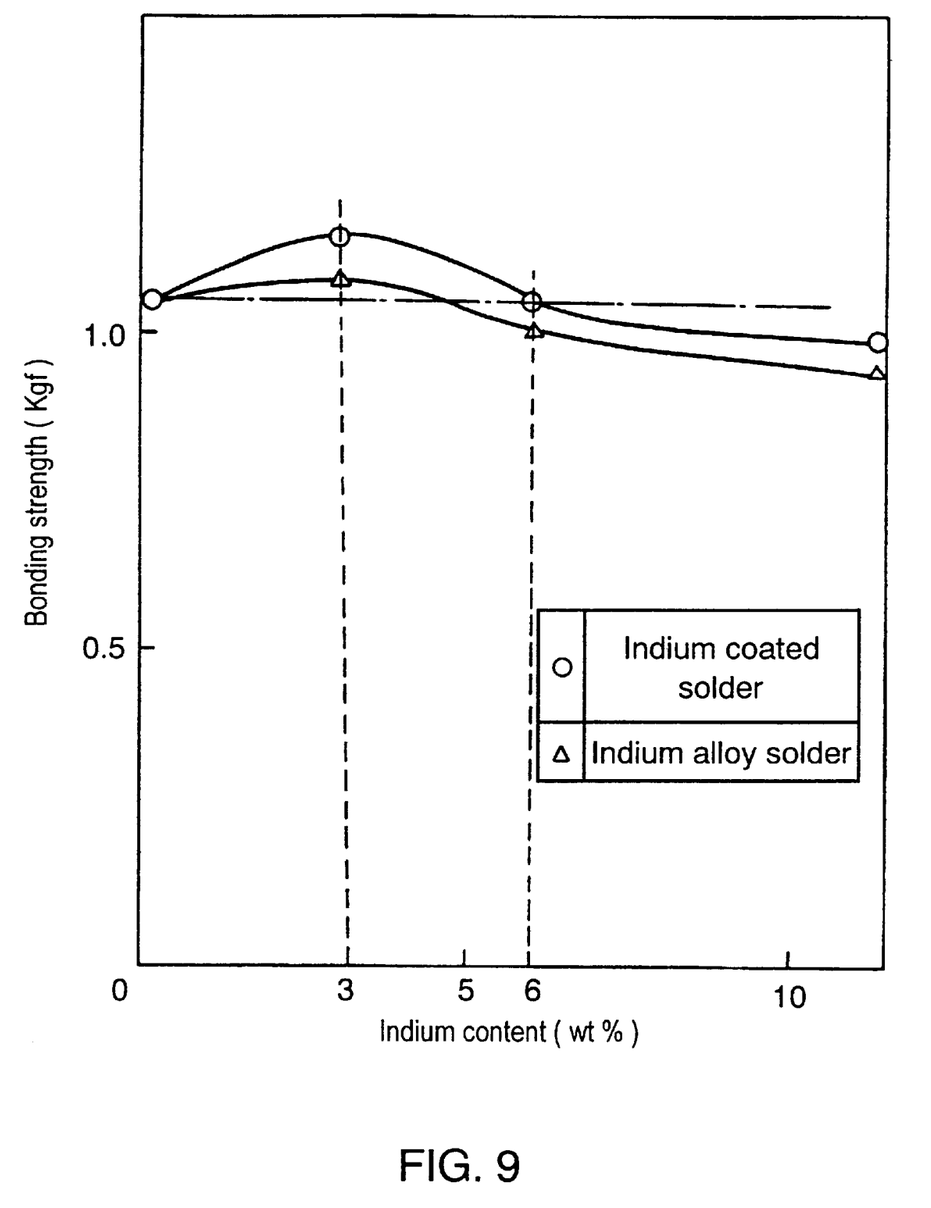
FIG. 9 is a comparison in bonding strength of solder coated with indium of the present invention and indium (In)-alloy solder.
Figure 10:
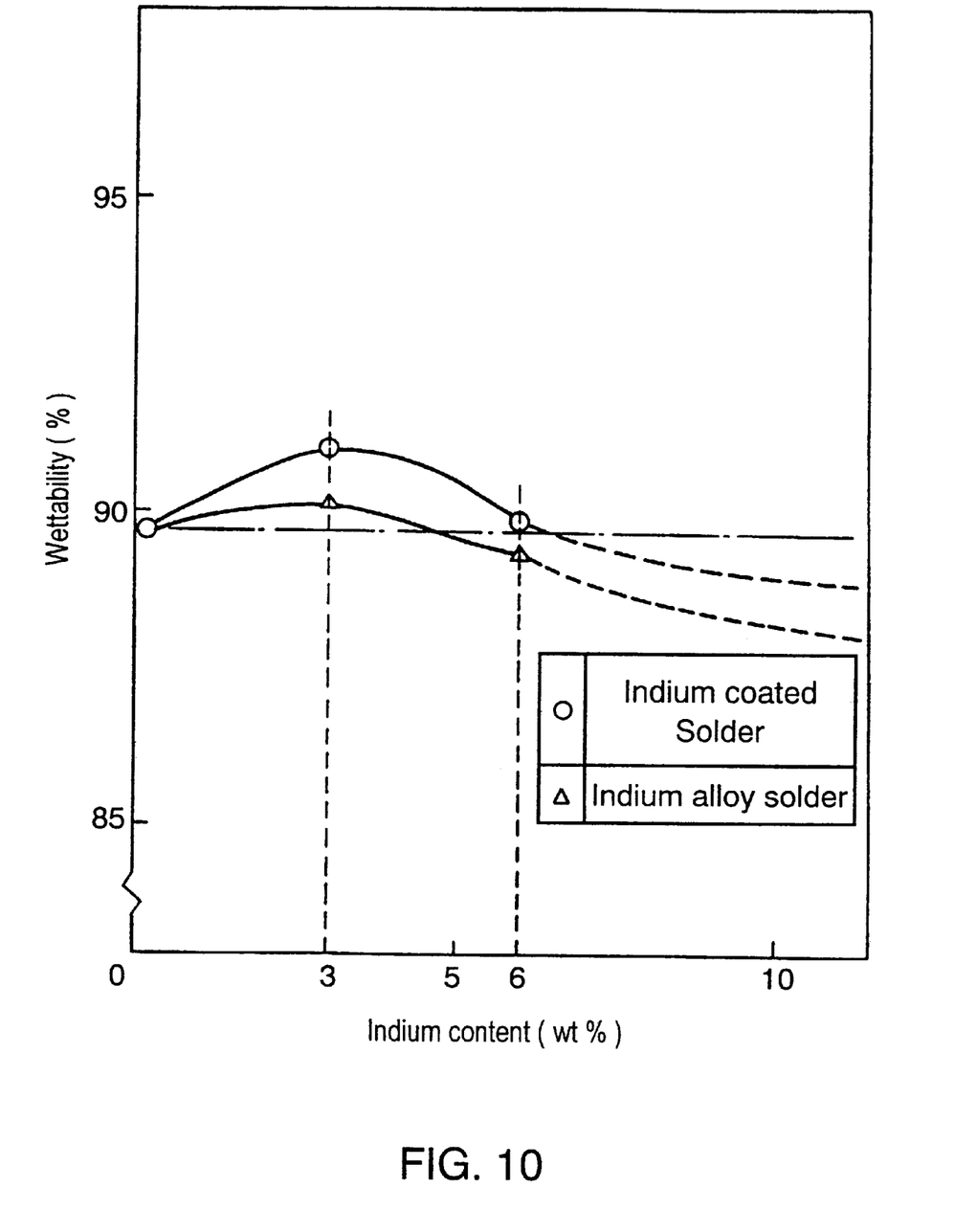
FIG. 10 is comparison of wettability of solder coated with indium of the present invention and indium (In)-alloy solder.

FIGS. 9 and 10 show comparison of bonding strength and wettability between solder coated with indium of the present invention and indium (In)-alloy solder. It is apparent from the figures that solder coated with indium of the present invention excels in both bonding strength and wettability to indium-alloy solder containing indium.

Table 2 shows a comparison of the number of partial chip detachments among conventional solder, indium (In)-alloy solder, and solder of the present invention. We counted the number of partial detachments in 10,000 individual 1005 chips, and calculated the percentage of occurrence.

TABLE 2

|  | Number of partial detachment | Percentage of occurrence rate (%) |
| --- | --- | --- |
| Solder paste of the present invention | 53 | 0.53 |
| Conventional solder paste | 150 | 1.50 |
| Indium (In)-alloy solder | 98 | 0.98 |

It is apparent that the number of partial chip detachments using the solder of the present invention is lower than that in the conventional solder and indium-alloy solder.

Tin and lead solder are used in the first exemplary embodiment, but the same improvements in wettability and bonding strength and reduction in the number of partial chip detachment are achievable with the use of lead-free solders.

Bismuth (Bi) is also applicable instead of indium (In). However, the occurrence of whisker is not preventable with the use of bismuth (Bi).

Second Exemplary Embodiment

Figure 11:
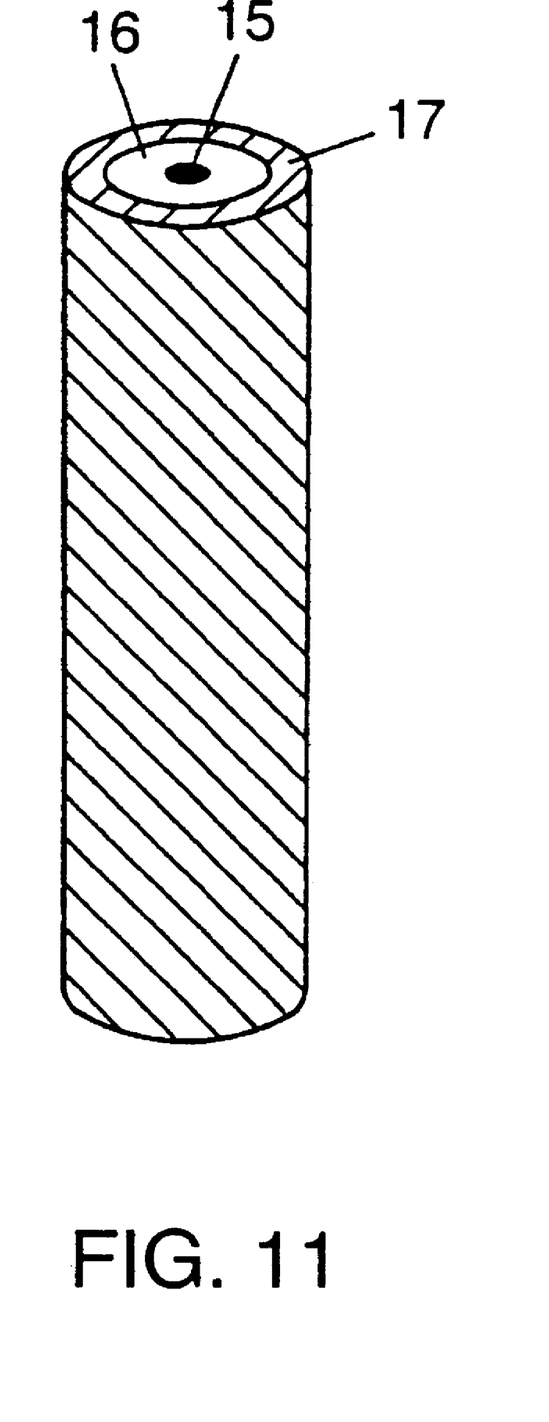
FIG. 11 is a solder wire in accordance with an exemplary embodiment of the present invention.

FIG. 11 shows a solder wire in an exemplary embodiment of the present invention. A flux 15 is coated with a solder core 16, and the solder core 16 is coated with indium (In) 17.

Table 3 shows experimental data for the solder wire as configured above. Table 3 is comparison of bonding strength between the conventional solder and the solder of the present invention. The same bonding strength test as explained in the first exemplary embodiment was conducted for measuring the bonding strength.

TABLE 3

| | Bonding strength F (kg) |
|---|---|
| Solder wire of the present invention | 1.19 |
| Conventional solder wire | 1.05 |

It is apparent from Table 3 that the solder wire of the present invention excels in bonding strength to the conventional solder wire.

The percentage of occurrence of partial chip detachment has also reduced same as in the first exemplary embodiment.

In the second exemplary embodiment, the conventional solder is used as the solder core. The same effect is also achievable with the use of lead-free solder.

In the first and second exemplary embodiments, the weight of indium (In) in alloy composition after the solder is melted is preferably 6 weight percentage or below. The reason for limiting content of indium (In) is because indium shows the maximum bonding strength and wettability when it is contained for 3 weight percentage as shown in FIGS. 9 and 10. When the content of indium exceeds 6 weight percentage, the bonding strength and wettability reduces below those of the solder without indium, which means there is no effect of adding indium (In).

In the above exemplary embodiments. solder paste and solder wire are used as an example. Any solder for surface mounting is applicable.

The above exemplary embodiments also use solder paste coated with indium (In), but the same effect is achievable by coating the lead-frame surface or electrode surface of the electronic component or coating the copper (Cu) land surface.

Exemplary embodiments for an electronic components and electronic circuit board are explained next.

Third Exemplary Embodiment

Figure 12A:
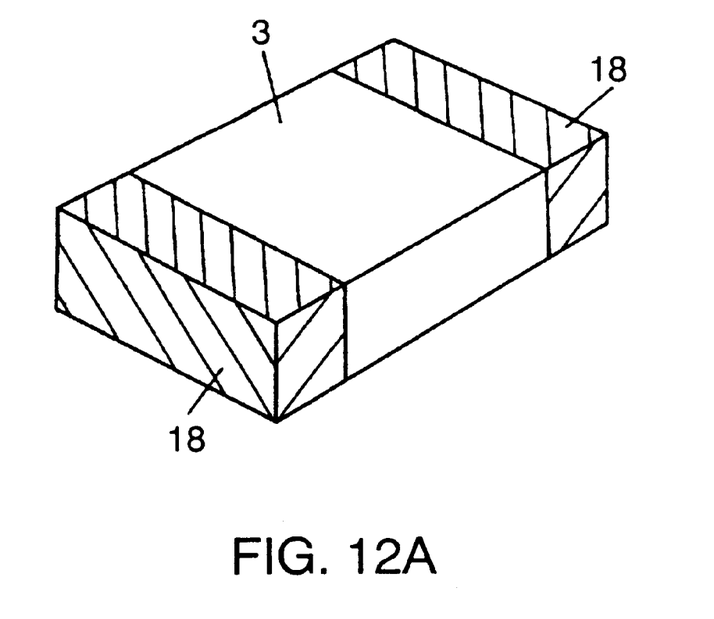
FIGS. 12A and 12B are electronic components whose lead-frame surface and electrode surface are coated in accordance with an exemplary embodiment of the present invention.
Figure 12B:
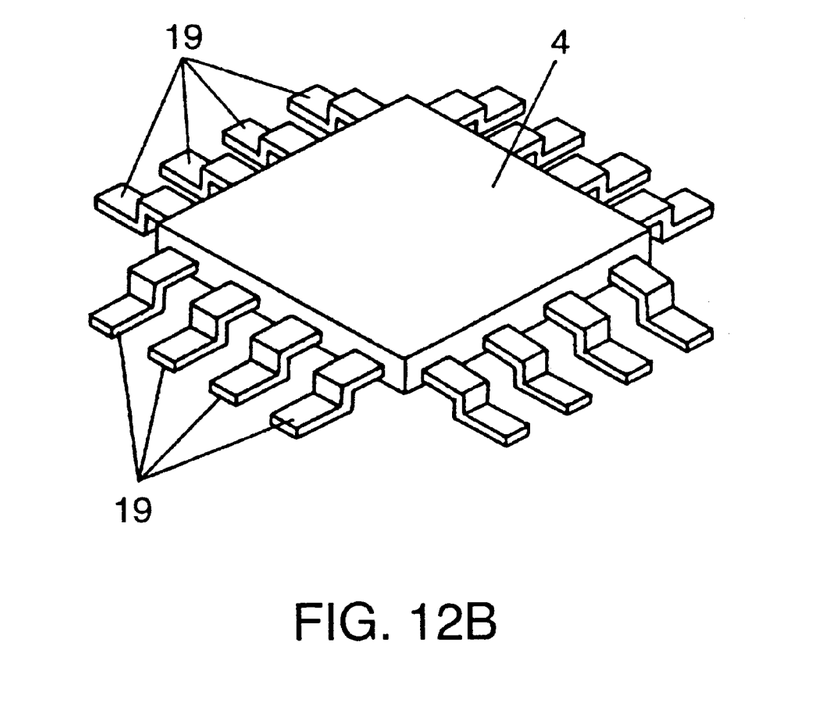

FIGS. 12A and 12B show an electronic component whose lead-frame surface and electrode surface are coated in an exemplary embodiment of the present invention.

The surfaces of an electrode 18 and lead frame 19 of the electronic component are coated with the indium (I) 2.

When this electronic component is mounted on an electronic circuit board by soldering, the same effect as the use of the solder of the above exemplary embodiments can be achieved. Further effect is achievable by using the solder of the present invention together for soldering.

Fourth Exemplary Embodiment

Figure 13A:
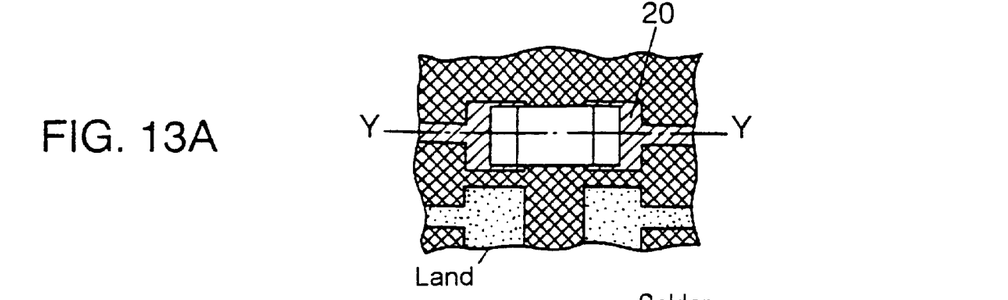
FIGS. 13A and 13B are electronic circuit boards whose copper (Cu) land surface is coated with indium in accordance with an exemplary embodiment of the present invention.
Figure 13B:
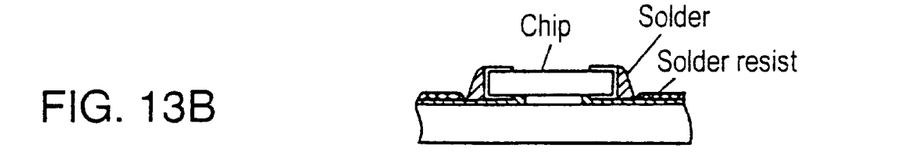

FIGS. 13A and 13B show an electronic circuit board whose surface of copper (Cu) land is coated with indium (In) in an exemplary embodiment of the present invention.

A land 20 on the electronic circuit board is coated with indium.

When electronic components are mounted on the electronic circuit board and soldered, the same effect as the use of the solder of the above exemplary embodiments can be achieved. Further effect is achievable by using the solder of the present invention together for soldering.

Hardness of the indium (In) is 0.9 HB (HB: Brinell hardness), which is softer than tin (5.3 HB), lead (33 HB), and the conventional solder. When electronic components coated with indium and an electronic circuit board coated with indium are used, solderless contact is possible, enabling to offer solder-free electronic circuit boards.

Industrial Applicability

As explained above, the present invention enables to decrease surface tension of melted solder, improve wettability of solder, and increase bonding strength by coating solder material, lead frames and electrodes of electronic components, and copper (Cu) lands of electronic circuit boards with indium (In).

Progressive melting of eutectic alloy of indium (In) and tin and the solder core allows gradual wetting, and therefore the occurrence of partial chip detachment can be reduced.

Furthermore, indium (In) is more likely to mutually diffuse with copper (Cu) compared to other metals. This enables the creation of a sufficiently diffused layer on the boundary surface with the copper (Cu), thereby increasing the bonding strength. Indium (In) is also a softer metal than copper (Cu) and solder material. This enables indium (In) to act as a buffer, absorbing any distortion caused by the different linear expansion coefficients of copper (Cu) and solder material and thus suppressing the occurrence of cracking and reducing internal stress in solder material, and, further, suppressing the occurrence of tin (Sn) whisker.

Accordingly, the present invention enables improved wettability of solder, and reduced occurrence of cracking at soldered portions and partial chip detachment thereby assuring high reliability in assembly of electronic components.

Reference numerals for drawing 1 solder core
2 indium (In)
3 electronic component
4 electronic component (QFP)
5 electronic circuit board
6 lead frame
7 electrode
8 solder
9 land
10 surface boundary between the solder core 1 and indium (In) 2
11 eutectic alloy of the solder core 1 and indium (In) 2

What is claimed is:

1. Solder powder whose surface of a solder core containing tin is coated with one of indium (In) and bismuth (Bi).

2. Solder powder as defined in claim 1, wherein said surface is coated with indium, and said indium in alloy composition after the solder is melted is 6 weight percentage and below.

3. Solder paste which is a mixture of the solder powder as defined in claim 1 and flux.

4. Solder paste as defined in claim 3, wherein said surface is coated with indium, and said indium in alloy composition after the solder is melted is 6 weight percentage and below.

5. Solder wire in which a solder core containing tin is coated around the circumference of flux, and the circumference of said solder core is coated with one of indium (In) and bismuth (Bi).

6. A solder wire as defined in claim 5, wherein said circumference of said solder core is coated with indium, and said indium in alloy composition after the solder is melted is 6 weight percentage and below.

7. An electronic component whose one of lead-frame surface and electrode surface is coated with a solder containing indium, wherein said indium in alloy composition after the solder is melted is 6 weight percentage and below.

8. An electronic circuit board whose copper (Cu) land surface is coated with a solder containing indium, wherein said indium in alloy composition after the solder is melted is 6 weight percentage and below.

* * * * *